United States Patent
Kasai (10) Patent No.: US 9,606,166 B2
(45) Date of Patent: Mar. 28, 2017

(54) INSULATION INSPECTION APPARATUS AND INSULATION INSPECTION METHOD

(71) Applicant: NIDEC-READ CORPORATION, Kyoto (JP)

(72) Inventor: Jun Kasai, Kyoto (JP)

(73) Assignee: Nidec-Read Corporation, Ukyo-ku, Kyoto (JP)

( * ) Notice: Subject to any disclaimer, the term of this patent is extended or adjusted under 35 U.S.C. 154(b) by 7 days.

(21) Appl. No.: 14/779,973

(22) PCT Filed: Mar. 27, 2014

(86) PCT No.: PCT/JP2014/001768
§ 371 (c)(1),
(2) Date: Sep. 25, 2015

(87) PCT Pub. No.: WO2014/156163
PCT Pub. Date: Oct. 2, 2014

(65) Prior Publication Data
US 2016/0054373 A1   Feb. 25, 2016

(30) Foreign Application Priority Data
Mar. 29, 2013 (JP) .................. 2013-072826

(51) Int. Cl.
*G01R 31/14* (2006.01)
*G01R 31/28* (2006.01)
*G01R 31/12* (2006.01)

(52) U.S. Cl.
CPC ......... *G01R 31/14* (2013.01); *G01R 31/1272* (2013.01); *G01R 31/28* (2013.01); *G01R 31/2805* (2013.01)

(58) Field of Classification Search
USPC ....................................................... 324/551
See application file for complete search history.

(56) References Cited

U.S. PATENT DOCUMENTS

| | | | |
|---|---|---|---|
| 2012/0119755 A1* | 5/2012 | Ishii .................... | G01R 27/025 324/551 |
| 2016/0178690 A1* | 6/2016 | Kasai ................ | G01R 31/1272 324/551 |

FOREIGN PATENT DOCUMENTS

| | | |
|---|---|---|
| JP | 2003172757 A | 6/2003 |
| JP | 2008089485 A | 4/2008 |
| JP | 2008164416 A | 7/2008 |

OTHER PUBLICATIONS

International Search Report issued in the corresponding PCT International Application No. PCT/JP2014/001768 dated Jun. 24, 2014, 1 page.

* cited by examiner

*Primary Examiner* — Minh Phan
(74) *Attorney, Agent, or Firm* — Viering, Jentschura & Partner mbB (57) ABSTRACT

An insulation inspection technique for allowing the occurrence of sparks to be detected more satisfactorily and allowing a board in which sparks have occurred to be more satisfactorily detected as being detective is provided. An insulation inspection apparatus detects a voltage induced between insulation inspection target wiring patterns by the application of a voltage during a time period from the start of the voltage application between the insulation inspection target wiring patterns to a predetermined time when the voltage between the insulation inspection target wiring patterns has stabilized. When a voltage drop due to sparks occurring between the insulation inspection target wiring patterns is detected during the time period, the board to be inspected is determined to be defective. In particular, supply current during the time period is set in accordance with the number of inspection points of an upstream wiring pattern of the insulation inspection target wiring patterns.

5 Claims, 5 Drawing Sheets

INSULATION INSPECTION APPARATUS AND INSULATION INSPECTION METHOD

RELATED APPLICATIONS

The present application is a national stage entry according to 35 U.S.C. §371 of PCT application No.: PCT/JP2014/001768 filed on Mar. 27, 2014, which claims priority from Japanese application No.: 2013-072826 filed on Mar. 29, 2013, and is incorporated herein by reference in its entirety.

TECHNICAL FIELD

Various embodiments relate to an insulation inspection apparatus for inspecting insulation between wiring patterns provided in a board to be inspected, and related technology.

BACKGROUND

A board (circuit board) having a plurality of wiring patterns is subjected to insulation inspection for inspecting the quality of a board by determining whether the condition of insulation between each pair of wiring patterns that is sequentially selected from among the plurality of wiring patterns is good or bad.

Specifically, the quality of a board to be inspected is determined based on a resistance value between a pair of wiring patterns. The resistance value is calculated based on a voltage applied between the pair of wiring patters at a predetermined time when the voltage applied to the pair of wiring patterns has stabilized after the start of the voltage application, and a current flowing between the pair of wiring patterns at the predetermined time.

In such insulation inspection, a relatively high voltage is applied between each pair of wiring patterns. Thus, there are cases where sparks occur between a pair of wiring patterns (more specifically, in a portion having an insufficient insulating condition) and defects caused by the sparks also arise.

In view of this, there is a technique for allowing such a board where sparks have occurred to be more reliably distinguished as being defective (see JP 2003-172757A).

The technique disclosed in JP 2003-172757A is for detecting a voltage induced between a pair of wiring patterns by the application of a voltage during a time period from the time when the voltage application to the pair of wiring patterns is started to a predetermined time when the voltage has stabilized. If a voltage drop of the detected voltage is detected during this time period, the board to be inspected is determined to be defective.

SUMMARY

Incidentally, in the insulation inspection as described above, it is preferable for the time period from the time when the voltage application to a pair of wiring patterns is started to a predetermined time when the voltage has stabilized to be shortened as much as possible from the viewpoint of reducing the time required for the insulation inspection. Thus, a relatively high current is passed through the pair of wiring patterns when a voltage is applied to the pair of wiring patterns during the time period.

However, in the case of performing the inspection disclosed in JP 2003-172757A, it has been found that if a relatively high current is passed through every pair of wiring patterns that is extracted from a large number of wiring patterns, there are cases where the occurrence of sparks cannot be detected properly because of not being able to properly detect a voltage drop.

In view of this, various embodiments provide an insulation inspection technique for allowing the occurrence of sparks to be detected more satisfactorily and allowing a board in which sparks have occurred to be more satisfactorily distinguished as being defective.

Means for Solving Problems

One aspect of the present disclosure is an insulation inspection apparatus for performing insulation inspection on a board to be inspected. It includes power supply device for applying a voltage between a pair of wiring patterns consisting of an upstream wiring pattern and a downstream wiring pattern that are selected as insulation inspection target wiring patterns from among a plurality of wiring patterns provided in the board to be inspected, current adjustment device for adjusting a supply current that is supplied from the power supply device at the time of the voltage application, voltage detection device for detecting a voltage induced between the pair of wiring patterns by the voltage application, voltage drop detection device for detecting whether or not a voltage drop has occurred due to sparks occurring between the pair of wiring patterns, during a time period from the start of the voltage application to a predetermined time when the voltage induced between the pair of wiring patterns has stabilized, determination device for, when the voltage-drop detection device detects the voltage drop, determining that the board to be inspected is defective, and storage device for storing the number of inspection points provided in each of the plurality of wiring patterns, wherein the current adjustment device adjusts the supply current in accordance with a first number of inspection points that is the number of inspection points provided in the upstream wiring pattern.

In one embodiment, the current adjustment device is configured to set the supply current to a first current value if the first number of inspection points is greater than or equal to a predetermined number and to set the supply current to a second current value smaller than the first current value if the first number of inspection points is smaller than the predetermined number.

In another embodiment, the current adjustment device divides the numbers of inspection points stored in the storage device into a predetermined number of groups and sets the supply current to a current value in accordance with a group to which the first number of inspection points belongs, and a current value that is set in accordance with a group corresponding to a relatively small number of inspection points is smaller than a current value that is set in accordance with another group corresponding to a relatively large number of inspection points.

In another embodiment, the determination device calculates a resistance value between the pair of wiring patterns on the basis of the voltage between the pair of wiring patterns at the predetermined time and the current flowing between the pair of wiring patterns at the predetermined time, and determines quality of the board to be inspected on the basis of the resistance value.

Various embodiments further provide an insulation inspection method for performing insulation inspection on a board to be inspected. The method includes the steps of a) starting application of a voltage between a pair of wiring patterns including an upstream wiring pattern and a downstream wiring pattern that are selected as insulation inspection target wiring patterns from among a plurality of wiring patterns provided in the board to be inspected, and b) detecting a voltage induced between the pair of wiring patterns by the voltage application during a time period from when the start of the voltage application to a predetermined time when the voltage between the pair of wiring patterns has stabilized. During the time period, a supply current at the time of the voltage application is adjusted in accordance with a first number of inspection points that is the number of inspection points provided in the upstream wiring pattern. When a voltage drop due to sparks occurring between the pair of wiring patterns is detected during the time period, the board to be inspected is determined to be defective.

According to various embodiments, it is possible to more satisfactorily detect a voltage drop due to sparks and to more satisfactorily detect the occurrence of sparks. Hence, it is possible to more satisfactorily detect defective boards.

BRIEF DESCRIPTION OF DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

The following detailed description refers to the accompanying drawings that show, by way of illustration, specific details and aspects of this disclosure in which the invention may be practiced.

1. Apparatus Configuration

Figure 1:
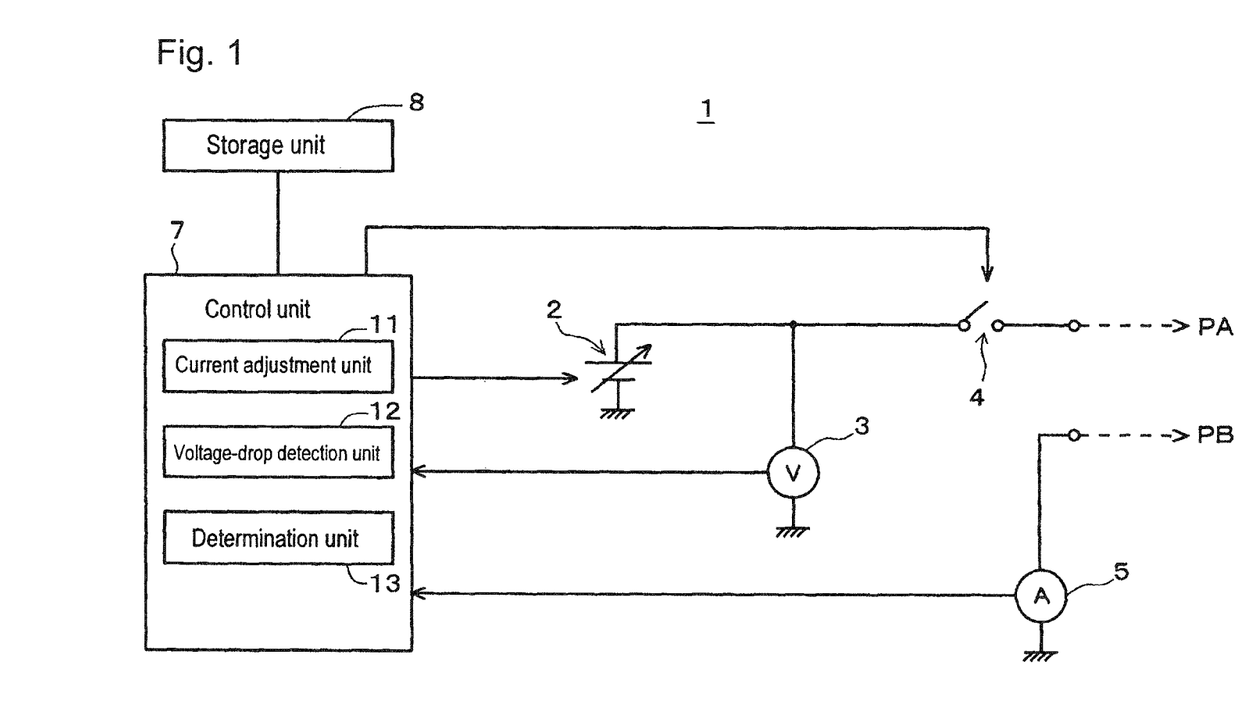
FIG. 1 shows an overall configuration of an insulation inspection apparatus.

FIG. 1 is a schematic diagram showing an overall configuration of an insulation inspection apparatus 1.

The insulation inspection apparatus 1 is an insulation inspection apparatus for inspecting insulation among a plurality of wiring patterns provided in a board to be inspected (circuit board). Examples of the board to be inspected include various boards such as a printed wiring board, a flexible board, a multilayer wiring board, and a package board for semiconductor packaging.

As shown in FIG. 1, the insulation inspection apparatus 1 includes a power supply 2, a voltmeter 3, an ammeter 5, a control unit 7, and a storage unit 8.

The power supply 2 applies a relatively high voltage (e.g., 200V) between wiring patterns targeted for insulation inspection (insulation inspection target wiring patterns) that are sequentially selected from among a plurality of wiring patterns. The insulation inspection target wiring patterns are classified into two wiring patterns that include an upstream wiring pattern PA connected to an upstream (anode or high-potential) terminal of the power supply 2 at the time of the voltage application in the insulation inspection and a downstream wiring pattern PB connected to a downstream (cathode or low-potential) terminal of the power supply at the time of the voltage application. Note that the upstream wiring pattern PA and the upstream terminal of the power supply 2 are electrically connected to each other via a probe, and the downstream wiring pattern PB and the downstream terminal of the power supply 2 are electrically connected to each other via another probe.

The power supply 2 here is configured as a variable-voltage source. The power supply 2 is also capable of adjusting the supply current at the time of the voltage application to a constant value. In other words, the power supply 2 is capable of causing the voltage between the wiring patterns PA and PB to reach an arbitrary output voltage value Vα while "charging" the electrostatic capacitance between the wiring patterns PA and PB by supplying current (supply current) having a constant value. When the charging of the electrostatic capacitance between the wiring patterns PA and PB is completed, the current from the power supply 2 is basically reduced to a value smaller than the above constant value. Thus, it can be said that the above constant value is a limit value (upper limit value) of the supply current. As will be described later, the supply current (specifically, the limit value of the supply current) from the power supply 2 can be set to one of a plurality of values (e.g., values I1 and I2).

The voltmeter 3 detects the value of the voltage induced between the insulation inspection target wiring patterns PA and PB by the voltage application from the power supply 2 (specifically, the voltage between the upstream wiring pattern and the downstream wiring pattern).

The ammeter 5 detects the value of the current flowing between the insulation inspection target wiring patterns PA and PB at the time of the voltage application from the power supply 2.

The storage unit 8 stores, for each of a plurality of wiring patterns, the number of inspection points (in particular, the number of inspection points for continuity inspection), which will be described later, provided in the wiring pattern.

The control unit 7 is a controller that includes, for example, a current adjustment unit 11, a voltage-drop detection unit 12, and a determination unit 13.

The current adjustment unit 11 is a processing unit for adjusting the supply current from the power supply 2 at the time of the voltage application from the power supply 2.

The voltage-drop detection unit 12 is a processing unit for detecting whether or not a voltage drop has occurred due to sparks occurring between the insulation inspection target wiring patterns. The voltage-drop detection unit 12 detects the occurrence or non-occurrence of a voltage drop during a time period TM (see FIGS. 3A and 3B) that is from the start of the voltage application between the insulation inspection target wiring patterns to a predetermined time when the voltage between the insulation inspection target wiring patterns has stabilized. Sparks caused by voltage application are detected by detecting the occurrence or non-occurrence of a voltage drop. Thus, the voltage-drop detection unit 12 is also referred to as a "spark detection unit" for detecting sparks.

Figure 2:
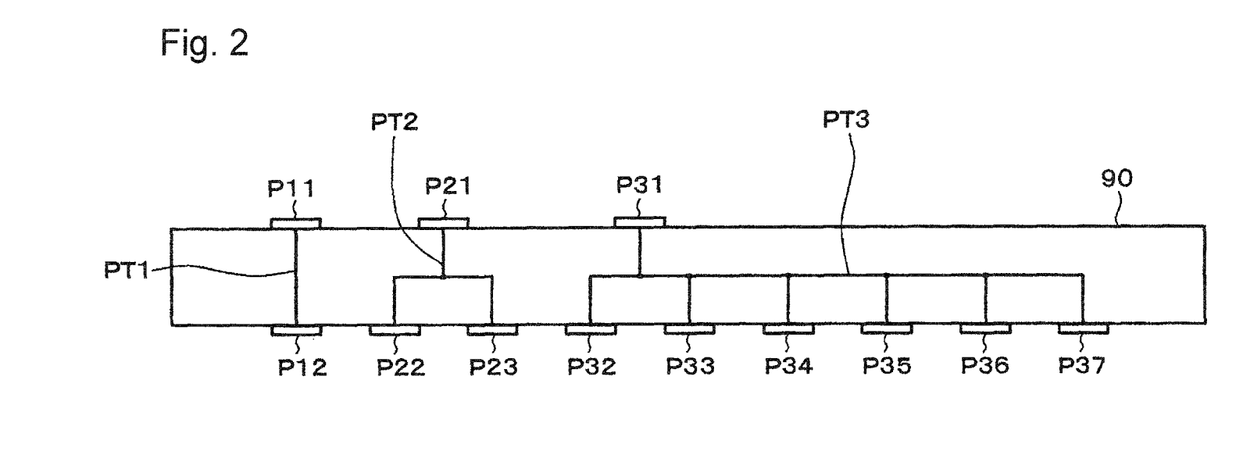
FIG. 2 shows an example of a board to be inspected.

The determination unit 13 is a processing unit for determining the quality of a board to be inspected (inspected board) 90 (see FIG. 2). For example, the determination unit 13 determines the quality of the inspected board 90, on the basis of the result of detection by the voltage-drop detection unit 12. More specifically, if the voltage-drop detection unit 12 has detected a voltage drop, the determination unit 13 determines that the inspected board 90 is defective. The determination unit 13 also calculates the value of resistance between the insulation inspection target wiring patterns PA and PB on the basis of the voltage and current between the insulation inspection target wiring patterns PA and PB at the predetermined time, and determines the quality of the inspected board on the basis of the resistance value.

FIG. 2 shows an example of the inspected board 90. The inspected board 90 shown in FIG. 2 is provided with a plurality of electrodes on its upper and lower sides. The electrodes on the upper side and the electrodes on the lower side are electrically connected to one another via wiring patterns provided inside the board. For example, an electrode P11 on the upper side and an electrode P12 on the lower side are electrically connected to each other. An electrode P21 on the upper side and electrodes P22 and P23 on the lower side are electrically connected to one another. To be more specific, the electrodes P21, P22, and P23 are electrically connected to one another via a conductor provided inside the board. Similarly, an electrode P31 on the upper side and electrodes P32 to P37 on the lower side are electrically connected to one another. To be more specific, the electrodes P31 to P37 are electrically connected to one another via a conductor provided inside the board.

Here, these electrodes are used as inspection points in the insulation inspection and continuity inspection, which will be described later.

In the continuity inspection, for example, the electrode P11 on the upper side and the electrode P12 on the lower side are used as inspection points to check continuity (good continuity) between the two electrodes P11 and P12. Similarly, the electrodes P21, P22, and P23 are used as inspection points in the continuity inspection to check continuity (good continuity) among the three electrodes P21, P22, and P23. The same applies to the continuity inspection for a larger number of electrodes, and the electrodes are each used as a inspection point in the continuity inspection.

In the insulation inspection, at least some of those electrodes are used as inspection points. For example, an arbitrary one of the two electrodes P11 and P12 provided in the wiring pattern PT1 and an arbitrary number of electrodes among the three electrodes P21, P22, and P23 provided in the wiring pattern PT2 are used as inspection points to inspect insulation between the two wiring patterns PT1 and PT2. Also, an arbitrary one of the two electrodes P11 and P12 provided in the wiring pattern PT1 and an arbitrary number of electrodes among the seven electrodes P31 to P37 provided in the wiring pattern PT3 are used as inspection points to inspect insulation between the two wiring patterns PT1 and PT3. Similarly, an arbitrary number of electrodes among the three electrodes P21 to P23 provided in the wiring pattern PT2 and an arbitrary number of electrodes among the seven electrodes P31 to P37 provided in the wiring pattern PT3 are used as inspection points to inspect insulation between the two wiring patterns PT2 and PT3.

In this way, the electrodes P11, P12, P21 to P23, and P31 to P37 are used as inspection points in various types of inspection (including the continuity inspection and the insulation inspection).

In the present example, the wiring pattern PT1 is provided with the two inspection points P11 and P12, and therefore, the number of inspection points for the wiring pattern PT1 is "2." Similarly, the wiring pattern PT2 is provided with the three inspection points P21 to P23, and therefore, the number of inspection points for the wiring pattern PT2 is "3." Similarly, the wiring pattern PT3 is provided with the seven inspection points P31 to P37, and therefore, the number of inspection points for the wiring pattern PT3 is "7."

The wiring patterns provided in the board include those configured by signal lines for transmitting various types of signals or the like and those for use in grounding the power supply. The numbers of electrodes (inspection points) provided in the former wiring patterns for signal lines are relatively small and is, for example, in the range of approximately 2 to 10. On the other hand, the numbers of electrodes (inspection points) provided in the latter wiring patterns (VG lines) for use in grounding the power supply are relatively large and is, for example, in the range of approximately 100 to 200.

The storage unit 8 stores the number of inspection points provided in each of a plurality of wiring patterns as described above (for each of the wiring patterns).

2. Outline of Insulation Inspection

The insulation inspection performed by the insulation inspection apparatus 1 is for determining the quality of the insulating condition between the insulation inspection target wiring patterns PA and PB among a plurality of wiring patterns provided in a board to be inspected (circuit board). This operation of determining the quality of the insulating condition between the insulation inspection target wiring patterns PA and PB is performed for all possible pairs of wiring patterns, and if it is determined that all the pairs of wiring patterns are in good insulating condition, the board is determined to be non-defective. On the other hand, if it is determined that any one of all the pairs of wiring patterns is not in good insulating condition, the board is determined to be defective.

The insulation inspection apparatus 1 detects a voltage V between a pair of wiring patterns (the upstream wiring pattern PA and the downstream wiring pattern PB) and a current I flowing between the pair of wiring patterns (PA, PB) at a predetermined time when the voltage has stabilized after the start of the application of a voltage to the pair of wiring patterns (PA, PB). The insulation inspection apparatus 1 calculates a resistance value between the pair of wiring patterns (PA, PB) on the basis of the two detected values (voltage value and current value) and determines the quality of the board to be inspected on the basis of the resistance value.

Figure 3A:
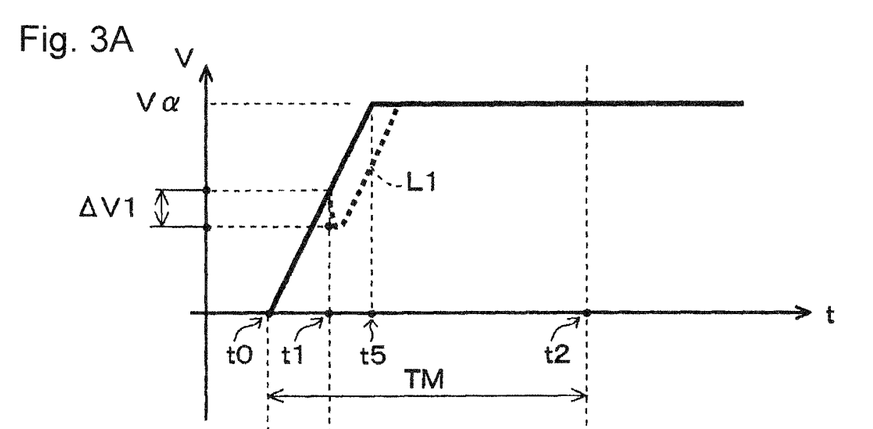
FIGS. 3A and 3B respectively show changes in the voltage measured by a voltmeter and the insulation resistance value over time.
Figure 3B:
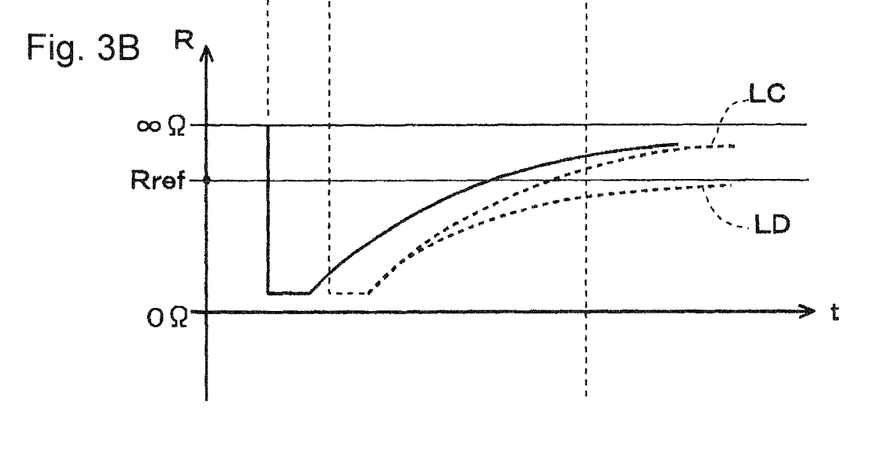

FIGS. 3A and 3B respectively show changes in the voltage measured by the voltmeter and the insulation resistance value over time. Now, a detailed description of the insulation inspection will be given with reference to FIGS. 3A and 3B.

First, when the control unit 7 turns a switch 4 on (time t0), the power supply 2 applies a relatively high output voltage Vα (e.g., 200V) between a pair of wiring patterns (PA, PB). The voltmeter 3 detects (measures) a voltage V between the pair of wiring patterns (PA, PB) and inputs the detection result (measured voltage value) to the control unit 7. The ammeter 5 detects a current I flowing between the pair of wiring patterns (PA, PB) and inputs the detection result (measured current value) to the control unit 7. In this way, the control unit 7 detects (measures) the voltage V and the current I between the pair of wiring patterns (PA, PB). These detection operations are performed at least during a time period TM that is from the start time t0 of the voltage application to a time t2.

FIG. 3A shows the change in the voltage V measured by the voltmeter 3 over time. As shown in FIG. 3A, with the voltage application from the power supply 2, the voltage V rapidly increases to a predetermined potential Vα and is thereafter maintained at the predetermined potential Vα. FIG. 3B shows the change in the insulation resistance value R over time.

The determination unit 13 calculates the value of resistance (insulation resistance value) R between the insulation inspection target wiring patterns on the basis of the measured voltage value V received from the voltmeter 3 and the measured current value I received from the ammeter 5 at the predetermined time (time t2) when the voltage V between the insulation inspection target wiring patterns has stabilized. Then, the determination unit 13 determines the quality of the insulating condition between the pair of wiring patterns (PA, PB) on the basis of the insulation resistance value R. Specifically, if the insulation resistance value R is greater than a predetermined threshold value Rref, the determination unit 13 determines that the pair of wiring patterns (PA, PB) is in good insulating condition. On the other hand, if the insulation resistance value R is smaller than the predetermined threshold value Rref, the determination unit 13 determines that the pair of wiring patterns (PA, PB) is not in good insulating condition. Note that the current value is unstable immediately after the start of the output application to the pair of wiring patterns (PA, PB). Thus, the operation of determining the insulating condition is preferably performed, not immediately after the start of the output application to the pair of wiring patterns (PA, PB), but after the time t2 when the voltage V between the pair of wiring patterns (PA, PB), which has reached the application voltage V$\alpha$, has stabilized.

3. Detection of Sparks Based on Detection of Voltage Drop

Next is a description of the detection of sparks based on the detection of a voltage drop.

In the insulation inspection as described above, a relatively high voltage V$\alpha$ is applied between the insulation inspection target wiring patterns. Thus, there are cases where sparks occur between the insulation inspection target wiring patterns (more specifically, in a portion having an insufficient insulating condition), as described above. The portion where sparks have occurred is damaged by the passage of a high current and thus has less reliability in insulation specification. Such a damaged board is preferably not determined to be non-defective.

Note that when sparks have occurred, the insulation resistance will change as indicated by a curve LC or LD, for example. If the change in the insulation resistance is as indicated by the curve LD, an insulation failure can properly be detected based on only the determination result at time t2. However, if the change in the insulation resistance is as indicated by the curve LC, it is not possible to properly detect an insulation failure based on only the determination result at time t2. In this way, the precision in the detection of a defective board decreases if only the determination result at time t2 is used.

Here, the occurrence of sparks causes a current flow, and this basically reduces the value V detected by the voltmeter 3. Using such properties, the insulation inspection apparatus 1 determines that sparks have occurred, when the voltage-drop detection unit 12 has detected a drop in the voltage V (i.e., voltage drop) as described above during the time period TM (time period from time t0 to time t2). If it is determined that sparks have occurred, the determination unit 13 determines that the board currently being inspected is defective.

This determination processing allows a board where sparks have occurred to be more reliably distinguished as being defective.

Incidentally, in the insulation inspection, it is preferable that the time period TM (time period from time t0 when the application of a voltage between the pair of wiring patterns is started to the predetermined time t2 when the voltage has stabilized), and in particular, a time period from time t0 to time t5 when the voltage substantially reaches the predetermined value V$\alpha$, is shortened as much as possible in order to reduce the time required for the insulation inspection. Hence, a relatively high current (e.g., several tens of milliamperes) is passed through the pair of wiring patterns when the voltage is applied between the pair of wiring patterns during the time period TM.

However, it has been found that if a relatively high current is supplied to every pair of wiring patterns that is extracted from a large number of wiring patterns, the occurrence of sparks cannot be detected properly because of not being able to properly detect a voltage drop.

For example, it is found that a voltage drop may not be able to be detected if a relatively high current is supplied to a wiring pattern constituted by a short signal line (e.g., PT1) when a voltage is applied to that wiring pattern.

Figure 5:
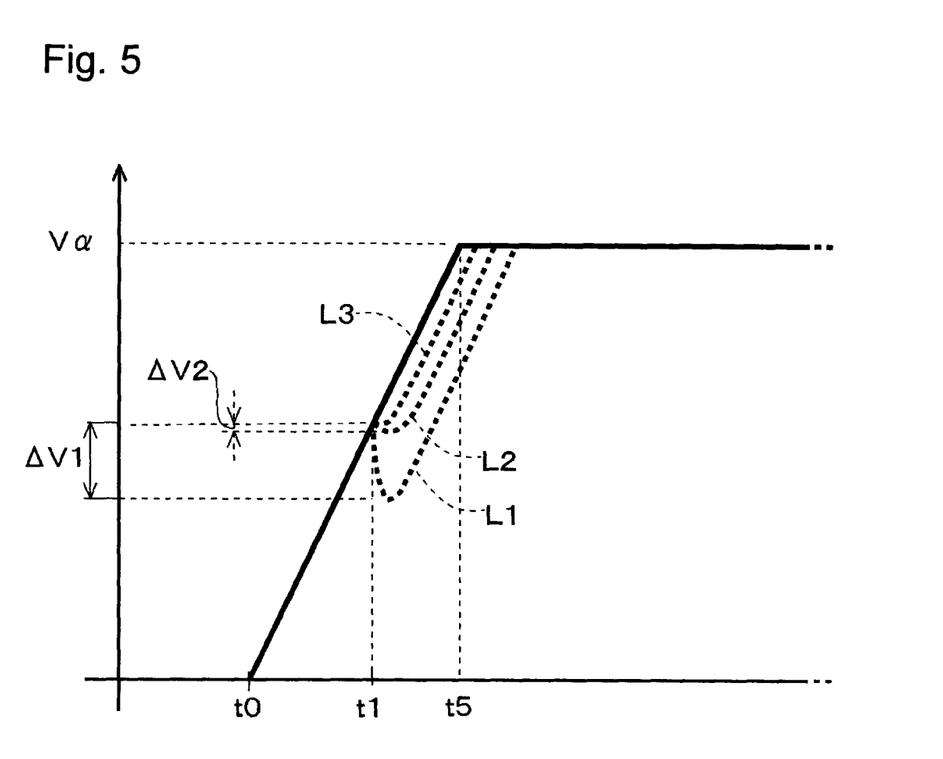
FIG. 5 is an enlarged view showing part of FIG. 3A.

In general, if spark current flows during voltage application, a voltage drop corresponding to the spark current will occur. For example, a broken line L1 in FIG. 5 indicates the occurrence of a voltage drop with the amount of drop $\Delta$V1. FIG. 5 is an enlarged view showing part of FIG. 3A.

However, in the case where a relatively high current I1 is supplied to a wiring pattern constituted by a relatively small signal line (specifically, the upstream wiring pattern), the supply current I1 may have a magnitude relatively close to that of a spark current IS. In this case, additional supply of the current I1 causes the amount of voltage drop $\Delta$V to remain at a relatively small value $\Delta$V2 (<$\Delta$V1) as indicated by the broken line L2 in FIG. 5. If the amount of drop $\Delta$V2 is smaller than the precision of detection (minimum detectable value), a voltage drop due to sparks cannot be detected properly. In other words, the occurrence of sparks cannot be detected properly.

Moreover, if the supply current I1 is greater than the spark current IS, a voltage drop itself may not occur as a result of additional supply of a relatively high current I1, as indicated by the broken line L3 in FIG. 5. In this case as well, the occurrence of sparks cannot be detected properly.

Here, the spark current occurs due to a positive charge, which was supplied from the power supply 2 to the upstream wiring pattern PA and accumulated therein at the time of the voltage application during the time period TM, flowing to a portion having an insulation failure (e.g., a portion to which copper powder is attached). Accordingly, the spark current increases as the electrostatic capacitance of the upstream (anode) wiring pattern PA increases, where the voltage is the same. Conversely, the spark current decreases as the electrostatic capacitance of the upstream wiring pattern PA decreases.

Consequently, if the upstream wiring pattern has a large electrostatic capacitance and the spark current IS is large, the spark current IS will increase sufficiently relative to the supply current I1, and accordingly, a voltage drop is easy to detect (see the broken line L1).

On the other hand, if the upstream wiring pattern has a small electrostatic capacitance and the spark current IS is small, the spark current IS will not increase sufficiently relative to the supply current I1 (e.g., the supply current I1 and the spark current IS have relatively equivalent magnitudes), and accordingly, a voltage drop is difficult to detect (see the broken lines L2 and L3).

Such circumstances are considered to cause the above phenomenon.

In view of this, in the present embodiment, the current supplied from the power supply 2 during the time period TM is adjusted in accordance with the characteristics of wiring patterns to be inspected (more specifically, the upstream wiring pattern PA), instead of passing a relatively high current to every pair of wiring patterns in the inspection.

Here, the characteristic of each wiring pattern to be inspected (more specifically, the upstream wiring pattern PA) is represented by the number N of inspection points provided in the wiring pattern.

The aforementioned number N of inspection points provided in a wiring pattern has a certain degree of correlation with the electrostatic capacitance of the wiring pattern (e.g., the length or area of the wiring pattern). In general, the length (and accordingly area) of a wiring pattern having a relatively small number of inspection points (e.g., N="2") is smaller than that of a wiring pattern having a relatively large number of inspection points (e.g., N="100"). Accordingly, the electrostatic capacitance of a wiring pattern having a relatively small number of inspection points (e.g., N="2") is smaller than that of a wiring pattern having a relatively large number of inspection points (e.g., N="100"). In view of this, in the present embodiment, the electrostatic capacitance of each wiring pattern is determined based on the number N of inspection points provided in the wiring pattern.

Note that it is not always easy to obtain the actual length (area) of each wiring pattern. In contrast, the electrostatic capacitance of each wiring pattern can relatively easily be estimated using the number of inspection points provided in the wiring pattern.

In particular, if there is a difference in the order of magnitude in relation to the number of inspection points (e.g., the number of inspection points differ in the order of 10 s or 100 s), the number of inspection points as described above can be used as good indicator of the area or the like of the wiring pattern.

The insulation inspection apparatus 1 adjusts the current supplied from the power supply 2 during the time period TM in accordance with the number N of inspection points provided in a wiring pattern to be inspected (specifically, the upstream wiring pattern PA). More specifically, the setting value of the current supplied from the power supply 2 at the time of the voltage application (in other words, the limit value (upper limit value) of the supply current) is changed according to the number N of inspection points.

More specifically, if the number N of inspection points provided in the wiring pattern PA is greater than a predetermined number Nr (e.g., 50), the current adjustment unit 11 sets the supply current (to be more specific, the limit value of the supply current) to a relatively large current value I1 (e.g., I1=several tens of milliamperes). On the other hand, if the number N of inspection points is smaller than the predetermined number Nr, the current adjustment unit 11 sets the supply current (to be more specific, the limit value of the supply current) to a relatively small current value I2 (<I1) (i.e., I2=several milliamperes).

In the case were the number N of inspection points is greater than the predetermined number Nr (e.g., 80), an increase in the time period TM can be prevented by setting the supply current from the power supply 2 to the relatively large current value I1. In other words, the time required for the insulation inspection can be shortened by reducing the time period TM.

In the case where the number N of inspection points is smaller than the predetermined number Nr, it is possible, by setting the supply current from the power supply 2 to the relatively small current value I2 (<I1), to reduce the occurrence of the aforementioned phenomenon (phenomenon in which a voltage drop is less likely to occur due to excessive current supply from the power supply at the time of occurrence of the spark current). According, the occurrence of sparks can more reliably be detected.

While FIGS. 3A and 5 show an example of the mode in which sparks occur during a time period in which the potential of the upstream wiring pattern increases toward a predetermined potential Vα from zero, the present disclosure is not limited to this embodiment. There are cases in which sparks occur during a time period from the time t5 (when the potential of the upstream wiring pattern has substantially increased to the predetermined value Vα) to the predetermined time t2. By adjusting the supply current from the power supply 2 as described above, the occurrence of such sparks (specifically, a voltage drop due to the sparks) can also be reliably defected.

4. Details of Operations

Figure 4:
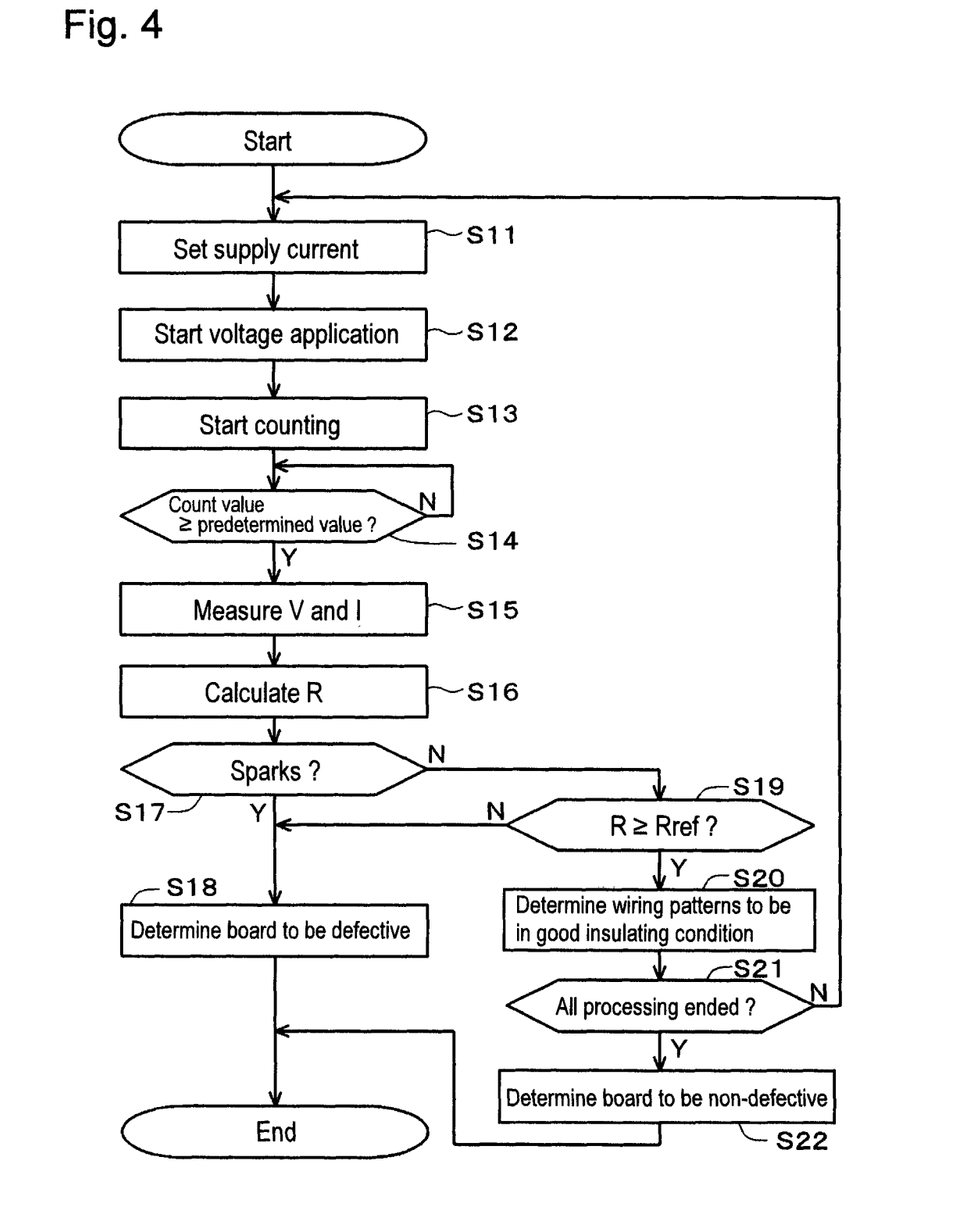
FIG. 4 is a flowchart of operations performed by the insulation inspection apparatus.

Next is a further detailed description of the operations performed by the insulation inspection apparatus 1 with reference to FIG. 4. FIG. 4 is a flowchart of the operations of the insulation inspection apparatus 1.

As shown in step S11 in FIG. 4, first the supply current (specifically, the limit value of the supply current) from the power supply 2 is set. Specifically, as described above, the current to be supplied from the power supply 2 during the time period TM is set according to the number N of inspection points provided in the wiring pattern to be inspected (specifically, the upstream wiring pattern PA). For example, if N=3, the supply current from the power supply 2 is set to a relatively small current value I2 (<I1). Note that in step S11, a voltage (e.g., 200V) to be applied between a pair of wiring patterns (PA, PB) is also set.

Then, in step S12, the switch 4 is turned on and the application of a voltage from the power supply 2 is started. Also, the control unit 7 starts counting, using its counter (not shown) (step S13).

In step S14, if it is determined that the count value has reached a predetermined value (in other words, the time has reached a value t2 after the start of the voltage application), the processing proceeds to step S15.

In step S15, the voltage V is measured by the voltmeter 3 and the current I is measured by the ammeter 5. Furthermore, the insulation resistance value R is calculated based on these measured values (voltage value and current value) (step S16).

In step S17, it is determined whether or not a voltage drop as described above has been detected during the time period TM (time period from the start time t0 of the voltage application to the predetermined time t2), i.e., whether or not sparks have been detected.

If sparks have been detected, it is determined that the pair of wiring patterns to be inspected (PA, PB) has an insulation failure, and accordingly, that the board to be inspected is defective (step S18).

On the other hand, if sparks have not been detected, the procedure proceeds to step S19. In step S19, it is determined whether or not the insulation resistance value R is greater than the predetermined threshold value Rref. If the insulation resistance value R is smaller than the predetermined threshold value Rref, it is determined that the pair of wiring patterns to be inspected (PA, PB) has an insulation failure, and accordingly, that the board to be inspected is defective (step S18). If the insulation resistance value R is greater than the predetermined threshold value Rref, it is determined that the pair of wiring patterns to be inspected (PA, PB) does not have an insulation failure (step S20), and the procedure proceeds to step S21.

In step S21, it is determined whether or not the processing of steps S11 to S20 has been performed on all possible pairs of wiring patterns extracted from a plurality of wiring patterns provided in the board to be inspected. If there is any pair of wiring patterns on which the processing has not yet been performed, the procedure returns to step S11, in which the processing is performed on this pair of wiring patterns (PA, PB) that have not yet been processed. On the other hand, if the above-described processing has been performed on all of the pair of wiring patterns, it is determined that the board to be inspected is non-defective (step S22), and the insulation inspection ends.

5. Variations

While the above has been a description of an embodiment of the present disclosure, the present disclosure is not intended to be limited to the content described above.

For example, while the above-described embodiment takes the example of the mode in which the voltage-drop detection unit 12 and other units are provided in the controller, the present disclosure is not limited thereto, and the voltage-drop detection unit 12 and other units may be configured as a hardware circuit that is separate from the controller. The voltage-drop detection unit 12 may be configured by, for example, a sample-and-hold circuit and a comparator. More specifically, the voltage-drop detection unit 12 may be configured to sample a voltage signal that is output from the voltmeter 3 at a predetermined cycle, compare the voltage signal sampled this time with that obtained by the previous sampling, and output a spark detection signal upon detection of the falling edge of the voltage waveform.

While the above-described embodiment takes the example of the insulation inspection apparatus 1 that uses a set of probes to perform insulation inspection on a set of wiring patterns, the present disclosure is not limited thereto. For example, the insulation inspection apparatus may use a plurality of probes to continuously perform insulation inspection on a plurality of sets of wiring patterns. Specifically, N probes are individually connected in advance to N wiring patterns, and a switching circuit is provided to select an arbitrary number of probes as inspection targets from among the N probes. Then, the inspection is performed while sequentially switching a plurality of combinations for extracting the upstream wiring pattern PA and the downstream wiring pattern PB from among the N wiring patterns.

While the above-described embodiment takes the example of the mode in which the two wiring patterns including the upstream wiring pattern PA and the downstream wiring pattern PB, which are insulation inspection target wiring patterns, are each configured by a single wiring pattern, the present disclosure is not limited thereto. For example, the downstream wiring pattern PB may be configured by a plurality of wiring patterns. More specifically, among the five wiring patterns PT1 to PT5, the wiring pattern PT1 may be connected to the upstream terminal of the power supply 2 and the other wiring patterns PT2 to PT5 may be connected to the downstream terminal of the power supply 2. In this way, the downstream wiring pattern PB may be configured by the plurality of wiring patterns PT2 to PT5 (whereas the upstream wiring pattern PA may be configured by the single wiring pattern PT1). Similarly, the upstream wiring pattern PA may be configured by a plurality of wiring patterns.

As described above, among two or more insulation inspection target wiring patterns, at least one wiring pattern that is electrically connected to the upstream terminal of the power supply 2 may function as the upstream wiring pattern PA, and at least one wiring pattern that is electrically connected to the downstream terminal of the power supply 2 may function as the downstream wiring pattern PB.

While the above-described embodiment takes the example of the mode in which the supply current (specifically, the limit value of the supply current) from the power supply 2 is set to one of the two-level values I1 and I2 according to the number N of inspection points provided in the upstream wiring pattern PA, the present disclosure is not limited thereto. The supply current (specifically, the limit value of the supply current) from the power supply 2 may be set to one of multilevel values Ij (j=1, 2, . . . , K, where K is a natural number of three or more). More specifically, the numbers of inspection points stored in the storage unit 8 (the numbers of inspection points provided respectively in a plurality of wiring patterns) may be divided into a predetermined number of groups, and the supply current may be set to a current value corresponding to a group to which the number N of inspection points provided in the upstream wiring pattern PA to be inspected belongs. For a group corresponding to a relatively small number of inspection points, a current value may be set that is smaller than that set for a group corresponding to a relatively large number of inspection points.

For example, if K=3, the number N of inspection points that is 100 or greater is classified into a first group GP1, the number N of inspection points that is 10 or greater and less than 100 is classified into a second group GP2, and the number N of inspection points that is 2 or greater and less than 10 is classified into a third group GP3. Then, if the number N of inspection points provided in the upstream wiring pattern PA to be inspected belongs to the first group GP1 (e.g., N=200), the supply current may be set to a current value I1 corresponding to the first group GP1. Similarly, if the number N of inspection points belongs to the second group GP2 (e.g., N=50), the supply current may be set to a current value I2 (<I1) corresponding to the second group GP2. If the number N of inspection points belongs to the third group GP3 (e.g., N=3), the supply current may be set to a current value I3 (<I2) corresponding to the third group GP3. In this way, the supply current from the power supply 2 is set to a relatively smaller value as the number N of inspection points decreases.

The invention claimed is:

1. An insulation inspection apparatus for performing insulation inspection on a board to be inspected, comprising:
    power supply device for applying a voltage between a pair of wiring patterns consisting of an upstream wiring pattern and a downstream wiring pattern that are selected as insulation inspection target wiring patterns from among a plurality of wiring patterns provided in the board to be inspected;
    current adjustment device for adjusting a supply current that is supplied from the power supply device at the time of the voltage application;
    voltage detection device for detecting a voltage induced between the pair of wiring patterns by the voltage application;
    voltage drop detection device for detecting whether or not a voltage drop has occurred due to sparks occurring between the pair of wiring patterns, during a time period from the start of the voltage application to a predetermined time when the voltage induced between the pair of wiring patterns has stabilized;
    determination device for, when the voltage-drop detection device detects the voltage drop, determining that the board to be inspected is defective; and storage device for storing the number of inspection points provided in each of the plurality of wiring patterns, wherein the current adjustment device adjusts the supply current in accordance with a first number of inspection points that is the number of inspection points provided in the upstream wiring pattern.

2. The insulation inspection apparatus according to claim 1, wherein the current adjustment device is configured to:
   set the supply current to a first current value if the first number of inspection points is greater than a predetermined number, and
   set the supply current to a second current value smaller than the first current value if the first number of inspection points is smaller than the predetermined number.

3. The insulation inspection apparatus according to claim 1, wherein the current adjustment device divides the numbers of inspection points stored in the storage device into a predetermined number of groups and sets the supply current to a current value in accordance with a group to which the first number of inspection points belongs, and
   a current value that is set in accordance with a group corresponding to a relatively small number of inspection points is smaller than a current value that is set in accordance with another group corresponding to a relatively large number of inspection points.

4. The insulation inspection apparatus according to claim 1, wherein
   the determination device calculates a resistance value between the pair of wiring patterns on the basis of the voltage between the pair of wiring patterns at the predetermined time and the current flowing between the pair of wiring patterns at the predetermined time, and determines quality of the board to be inspected on the basis of the resistance value.

5. An insulation inspection method for performing insulation inspection on a board to be inspected, the method comprising:
   a) starting application of a voltage between a pair of wiring patterns including an upstream wiring pattern and a downstream wiring pattern that are selected as insulation inspection target wiring patterns from among a plurality of wiring patterns provided in the board to be inspected; and
   b) detecting a voltage induced between the pair of wiring patterns by the voltage application during a time period from when the start of the voltage application to a predetermined time when the voltage between the pair of wiring patterns has stabilized,
   wherein, during the time period, a supply current at the time of the voltage application is adjusted in accordance with a first number of inspection points that is the number of inspection points provided in the upstream wiring pattern, and
   when a voltage drop due to sparks occurring between the pair of wiring patterns is detected during the time period, the board to be inspected is determined to be defective.

* * * * *